United States Patent
Ambilkar et al.

(10) Patent No.: US 7,093,065 B2
(45) Date of Patent: Aug. 15, 2006

(54) RANDOM ACCESS MEMORY INITIALIZATION

(75) Inventors: Shridhar Narasimha Ambilkar, Bangalore (IN); Girish Gopala Kurup, Karnataka (IN); Ashutosh Misra, Karnataka (IN)

(73) Assignee: International Business Machines Corporation, Armonk, NY (US)

( * ) Notice: Subject to any disclaimer, the term of this patent is extended or adjusted under 35 U.S.C. 154(b) by 371 days.

(21) Appl. No.: 10/736,057

(22) Filed: Dec. 15, 2003

(65) Prior Publication Data

US 2005/0129025 A1  Jun. 16, 2005

(51) Int. Cl.
*G06F 12/12* (2006.01)

(52) U.S. Cl. .................. 711/104; 711/166; 711/165; 713/1; 713/100; 370/449; 370/450; 370/451; 370/462

(58) Field of Classification Search ................ 711/166; 713/1
See application file for complete search history.

(56) References Cited

U.S. PATENT DOCUMENTS

| | | | | |
|---|---|---|---|---|
| 5,893,162 A | * | 4/1999 | Lau et al. | 711/153 |
| 6,467,023 B1 | * | 10/2002 | DeKoning et al. | 711/114 |
| 6,529,519 B1 | * | 3/2003 | Steiner et al. | 370/412 |

* cited by examiner

*Primary Examiner*—Reginald Bragdon
*Assistant Examiner*—Leonid Kravets
(74) *Attorney, Agent, or Firm*—Anthony V. S. England; T. Tao Coca

(57) ABSTRACT

A memory has a set of address spaces to which token data is written and read. Each address space has a token status bit. A token generator allocates token data to the memory address spaces. Upon a reset occurring, a logic circuit provides logic "0" to the token generator disabling status bit checking control so that all the tokens can be issued sequentially. New token data is allocated to the address spaces sequentially and the respective status bit is updated or maintained as logic "1". When all address spaces have been allocated, the logic circuit provides the actual state of the status bit to the token generator to control subsequent allocations.

3 Claims, 4 Drawing Sheets

US 7,093,065 B2

RANDOM ACCESS MEMORY INITIALIZATION

FIELD OF THE INVENTION

The present invention relates to the initialization of Random Access Memory (RAM).

BACKGROUND

In packet-based communication systems, an initiator sends a read-request packet to a target device. The target sends back a response data packet after some time. For the effective transmission of packets, the device should be able to send many read-request packets before receiving response packets from the target. To support this, the initiator assigns a token/tag to each read-request packet. The initiator can thus identify and handle response packets. The target should use the same token/tag in a response packet. The token is freed up and can be reused once this two-way transaction is completed. For each outstanding token, the initiator needs to remember properties such as address, data length, etc., of the read-request-packet, until a response packet is received.

At the start of a session all tokens are available and can be issued in any order. Once all the tokens are consumed, however, a new read-request packet can be formed only after a response packet is received to release the associated token. This situation occurs also in other applications of storage elements beyond packet-based communication systems.

A communications system will typically have 1024 or more tokens, and against each token, information about the read-request packet is stored (e.g. a 32 bit address, 12 bit data length, etc.). A circuit designer is thus forced to make use of SRAM/register-arrays instead of flip-flops to store this information and to save on chip area.

FIG. 1 shows a memory 10 that stores a set of token information 12, addressed as 0000 to 1023. The Most Significant Bit (MSB) 14 is used to indicate token status; a logic '1' indicates token is in use and a logic '0' indicates a token is free. Token information is output by the read port 22 to generate a respective token 24. To generate a new token, a memory controller firstly needs to check the status bit to determine whether the token address is already in use or not.

When memory is implemented in SRAM a problem that arises is the initial (power on) values of the SRAM locations cannot be predicted. A discrete "zeroing task" of the memory addresses thus required upon power-on, or soft reset, so that token assignment can occur in a sequential manner.

Since only one location can be accessed at a time, in this example, initialization requires 1024 clock cycles. As the size of the array increases, the time needed to initialize the RAM will increase, requiring the other parts of the related system to wait until the initialization completes. This can cause considerable performance degradation.

FIG. 2 shows a further implementation, in which an address generator (binary counter) 30 is used to access all locations of the RAM 10 during initialization. By counting through the set of addresses via the write address port 18, all status bit locations 14 are initialized with known value of logic "0" via the write port 20.

Once the address counter reaches address no. 1023, an overflow condition is generated, and an RS flip-flop 32 causes a logical multiplexer 34 to connect a token generator 36 to the write address port 18.

SUMMARY

A full reset of the status bit of each token address space can be avoided by disabling the status bit check during a first round of token assignment. The addresses can then be overwritten as tokens need to be allocated. Once the full set of addresses is used, the status bit check becomes active.

A memory has a set of address spaces to which token data is written and read. Each address space has a token status bit. A token generator allocates token data to the memory address spaces. Upon a reset occurring, a logic circuit provides logic "0" to the token generator indicating the current token is not in use. New token data is allocated to the address spaces sequentially and the respective status bit is updated or maintained as logic "1". When all address spaces are allocated, the logic circuit provides the actual state of the status bit to the token generator to control subsequent allocations.

This arrangement helps in avoiding the full reset of the status bits in the memory and thereby saving the clock cycles required to initialize them.

DETAILED DESCRIPTION

Figure 3:
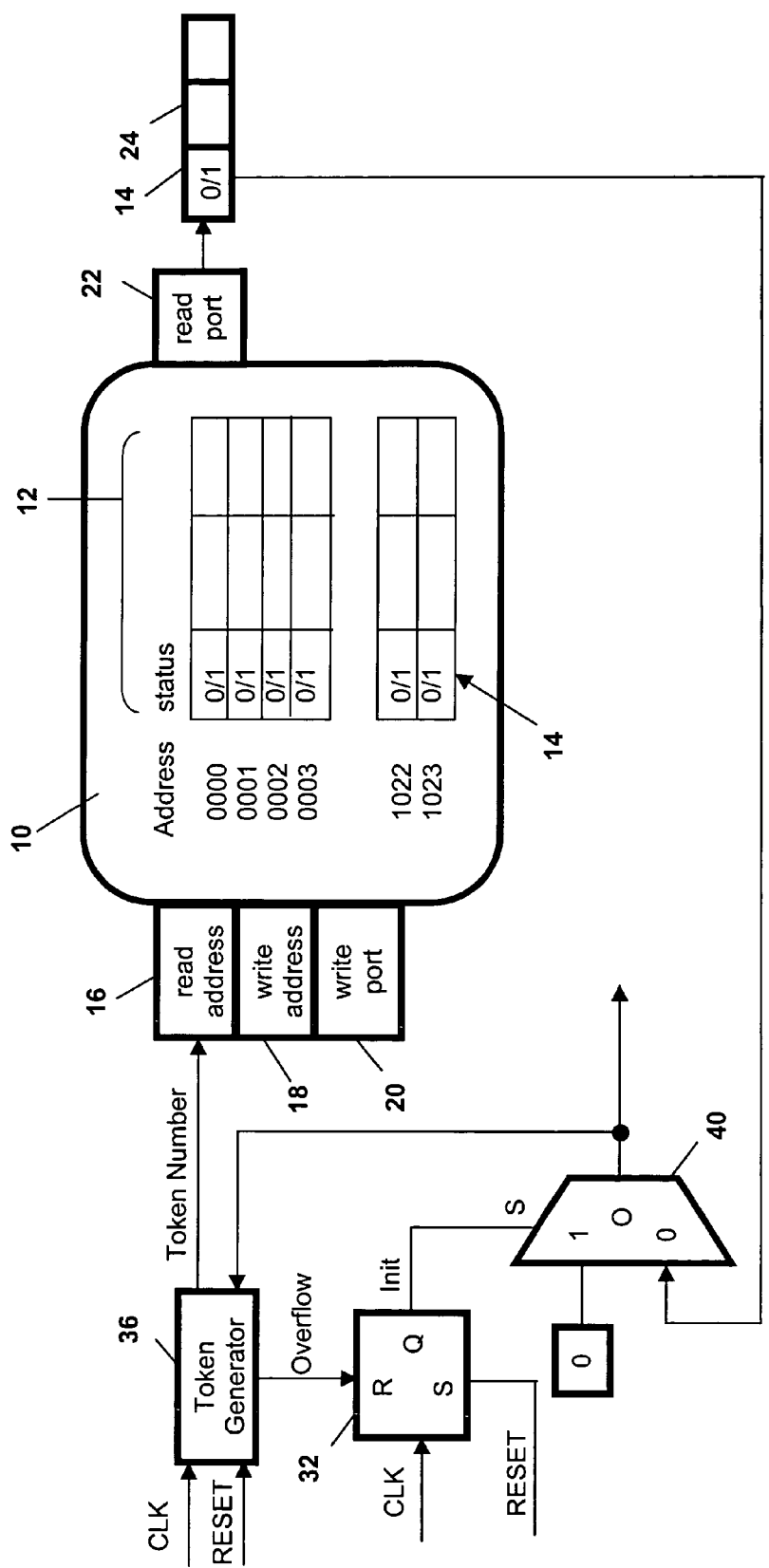
FIG. 3 is a memory arrangement embodying the invention.
Figure 4:
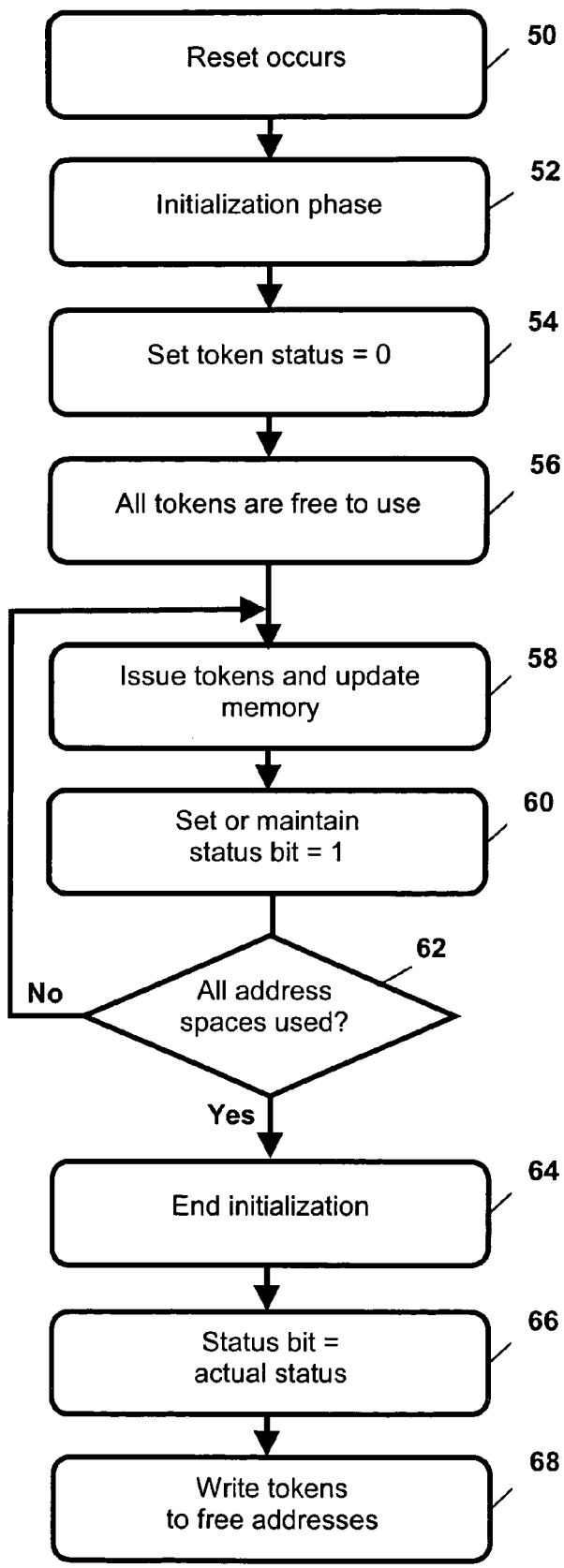
FIG. 4 is a flow diagram relating to the arrangement of FIG. 3.

FIG. 3 shows a memory arrangement embodying the invention, and should be read in conjunction with the flow diagram of FIG. 4.

On the occurrence of a reset event (step 50), a logic signal is clocked to the Reset input of the token generator 36 and to the S terminal of the RS flip-flop 32. The Q output of the flip-flop 32 is thus set to logic 1, indicating an initialisation phase (step 52). Logic 1 appears at the S terminal of a logical multiplexer 40 causing output of logic 0 (step 54) at the multiplexer output O. This is also fed-back to the token generator 36 indicating that all the tokens are free to use and can be issued in a sequence (step 56). The token status is thus assumed to be logic 0, indicating that no tokens are in use eventhough tokens may be existing within the memory address locations.

The token generator 36 is free to issue tokens and update the address spaces 12 via the write address port 18, typically, in this example, commencing from address 000 and progressing to address 1023. Any existing token is over-written. The respective status bit 14 is updated or remains with logic 1 as each token data is written to an address 12 (step 60).

The token generator 36 determines whether all addressed spaces have been used (step 62) and, if so, determines the end of the initialisation phase (step 64), and logic 1 appears on the overflow output of the token generator 36 to the R input of the flip-flop 32. This forces the Q output of the flip-flop 32 to logic 0, which, in turn, sets the output of the multiplexer 40 to the value appearing at the "0" input thereof. The "0" input of the multiplexer 40 receives the most significant bit of the token data 24 that has been pointed to, which, in turn, is provided by the output "O" of the multiplexer 40 to the token generator 36. In this way, the token generator 36 points to an address and receives an indication of whether a token can be issued and the corresponding memory location can be written based on the respective status bit 14 (step 66). Token data can now be written to available address spaces as they become available in the usual course of operation of the memory 10 (step 68).

Figure 1:
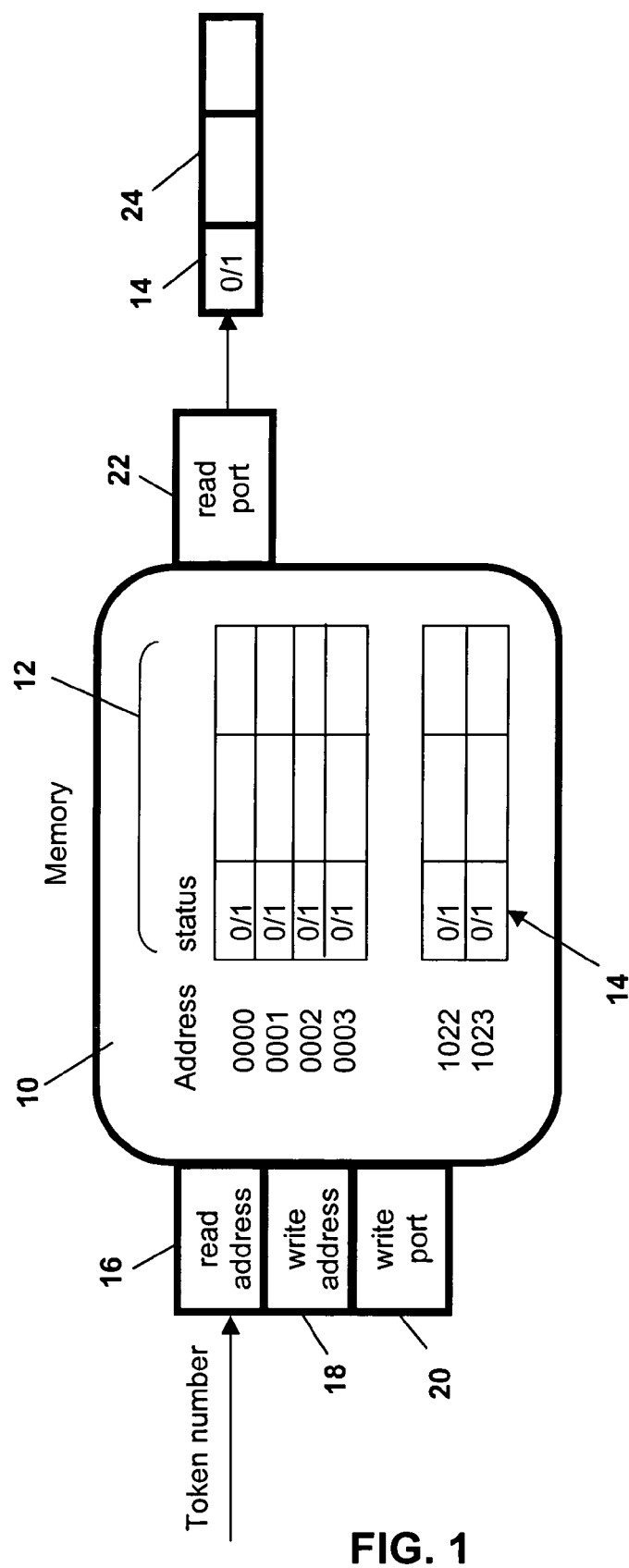
FIG. 1 is a known memory circuit.
Figure 2:
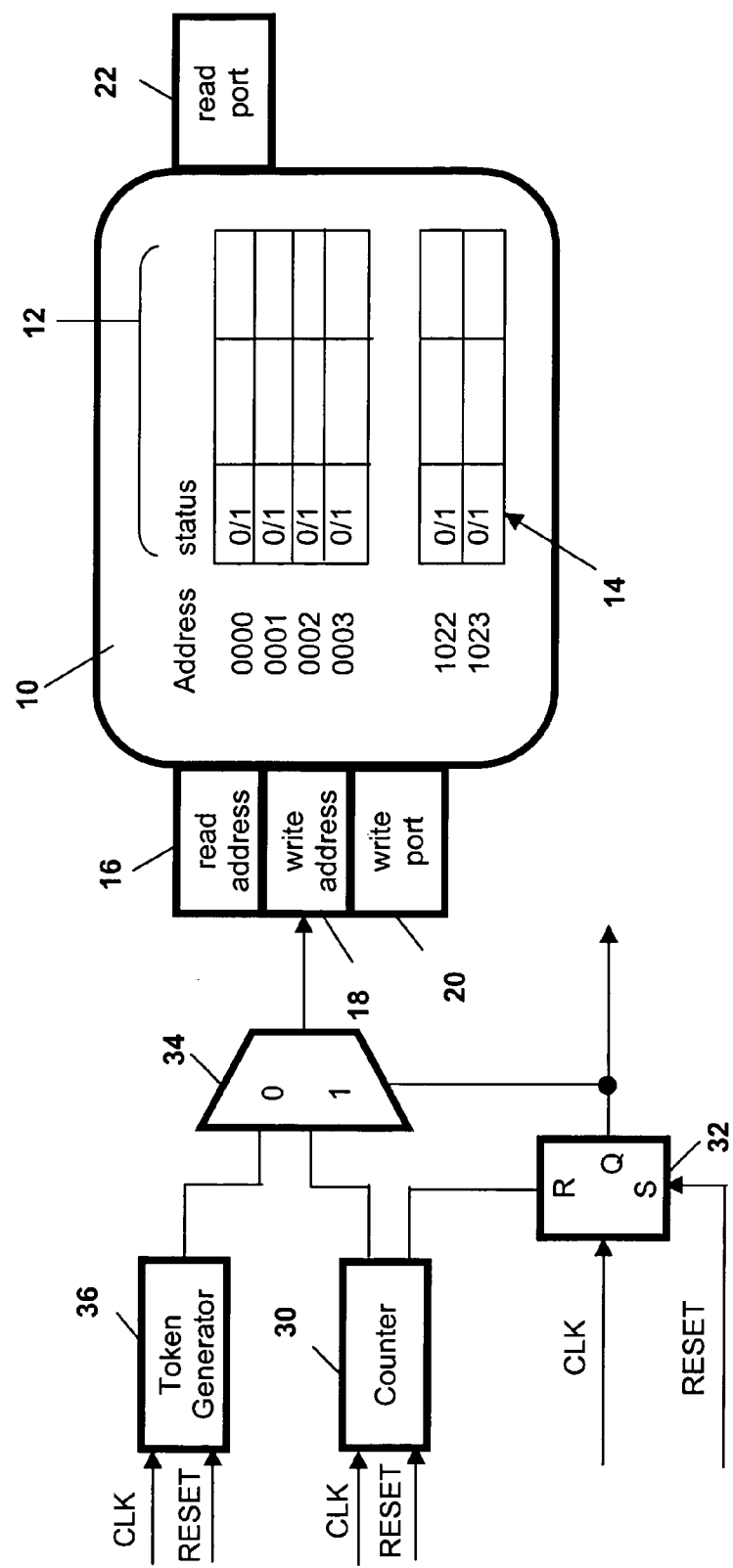
FIG. 2 is a known memory arrangement having reset logic.

In the conventional method described with reference to the example of FIG. 2, at least 1024 clock cycles are needed to initialize the status bit of the RAM. In the embodiment described, there is no need to wait for the initialization of status bits 14 in RAM 10. Tokens can be issued immediately after reset. In effect the initialization gets completed in the background when all tokens are issued a first time.

CONCLUSION

A memory having 1024 address locations is understood to be merely exemplary. Various alterations and modifications can be made to the techniques and arrangements described herein, as would be apparent to one skilled in the relevant art.

We claim:

1. A Random Access Memory initialization circuit comprising:
    a memory having a set of address spaces to which token data is written to and read from, each address space having a status bit indicating allocation of a token data thereto;
    a token generator for allocating token data to said memory address spaces; and
    a logic circuit; and
    wherein upon a reset event occurring, said logic circuit providing a logic "0" input to said token generator, thereby disabling the status bits, and said token generator allocating token data to said address spaces sequentially and the respective memory status bit being maintained or set to logic "1" upon each allocation, and further wherein, upon all said address spaces being occupied by allocating token data, said logic circuit enables the status bits and provides the actual state of the status bit of said address spaces to said token generator to control subsequent allocations.

2. The Random Access Memory initialization circuit of claim 1, wherein said logic circuit includes an R-S flip-flop receiving a reset signal on the S input and a logical multiplexer whose S input is connected with the Q output of the flip-flop and whose "1" input is forced to logic "0" and whose "0" input receives said status bit of an addressed memory space, and whose "O" output is connected to said token generator.

3. The Random Access Memory initialization circuit of claim 1, wherein said token generator determines whether all said address spaces are occupied by counting the number of token data allocated against the number of address spaces in said memory.

* * * * *